United States Patent
Sugamoto et al.

(10) Patent No.: US 6,462,997 B2
(45) Date of Patent: Oct. 8, 2002

(54) CIRCUIT FOR RESETTING A PAIR OF DATA BUSES OF A SEMICONDUCTOR MEMORY DEVICE

(75) Inventors: Hiroyuki Sugamoto, Kasugai (JP); Takaaki Furuyama, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 10 days.

(21) Appl. No.: 09/756,740

(22) Filed: Jan. 10, 2001

(65) Prior Publication Data

US 2001/0001261 A1 May 17, 2001

Related U.S. Application Data

(62) Division of application No. 09/457,369, filed on Dec. 9, 1999, now Pat. No. 6,198,680.

(30) Foreign Application Priority Data

Dec. 10, 1998 (JP) .......................................... 10-351256
Jul. 12, 1999 (JP) .......................................... 11-197401

(51) Int. Cl.$^7$ .................................................. G11C 7/00
(52) U.S. Cl. .................................. 365/203; 365/189.111
(58) Field of Search ........................... 365/203, 189.09, 365/189.11, 190, 205, 208

(56) References Cited

U.S. PATENT DOCUMENTS

| | | | | |
|---|---|---|---|---|
| 4,870,617 A | * | 9/1989 | Nakano et al. | 365/190 |
| 5,233,560 A | * | 8/1993 | Foss et al. | 365/203 |
| 5,257,226 A | | 10/1993 | McClure | 365/189.09 |
| 5,295,104 A | | 3/1994 | McClure | 365/210 |
| 5,502,684 A | * | 3/1996 | Koshikawa | 365/230.06 |
| 5,742,185 A | | 4/1998 | Lee | 326/86 |

FOREIGN PATENT DOCUMENTS

EP          0 547 892 A2    6/1993

* cited by examiner

*Primary Examiner*—Richard Elms
*Assistant Examiner*—Anh Phung

(57) ABSTRACT

A semiconductor memory, such as an SDRAM, includes a data bus pair, a first reset circuit, a second reset circuit and a control circuit. The first reset circuit is connected between the buses of the data bus pair and resets the buses at a first potential. The second reset circuit is also connected between the data buses and resets the buses at a second potential. The control circuit is connected to the first and second reset circuits and activates the first reset circuit and deactivates the second reset circuit prior to a write operation. The control circuit further deactivates the first reset circuit and activates the second reset circuit prior to a read operation.

11 Claims, 15 Drawing Sheets

CIRCUIT FOR RESETTING A PAIR OF DATA BUSES OF A SEMICONDUCTOR MEMORY DEVICE

This application is a division of Application Ser. No. 09/457,369 filed Dec. 9, 1999, now U.S. Pat. No. 6,198,680, issued on Mar. 6, 2001. The disclosure of the prior application is hereby incorporated by reference herein in its entirety.

BACKGROUND OF THE INVENTION

The present invention relates to a semiconductor memory device, and more particularly, to a circuit and a method for resetting a pair of data buses.

FIG. 1 is a schematic diagram of a part of a conventional semiconductor memory device 1 comprising a memory cell array 4 including a plurality of memory cells c, a plurality of word lines (not shown) and a plurality of bit line pairs BL1, /BL1 to BLn, /BLn. Each cell c is connected to one of the plurality word lines and also to one of bit lines of any pair BL1, /BL1 to BLn, /BLn. Only three pairs of bit lines, designated as first, second and third line pairs BL1, /BL1; BL2, /BL2; and BL3, /BL3 are shown in FIG. 1.

Sense amps 2a, 2b and 2c are connected between the first, second and third bit line pairs BL1, /BL1; Bl2, /BL2; and BL3, /BL3, respectively. Each of the sense amps 2a to 2c amplifies a potential difference between the associated one of the first, second and third bit line pairs BL1, /BL1 to BL3, /BL3. The bit lines pairs BL1 to BL3 and /BL1 to /BL3 are also connected to a pair of data buses DB, /DB via pairs of transfer gates 3a to 3c, respectively. Each pair of transfer gates 3a to 3c includes a pair of NMOS transistors having gates which receive a common column select signal col 1 to col3. When the column select signal col 1, for example, goes high, the transfer gates 3a are turned on, thus electrically connecting the first bit line pair BL1, /BL1 to the data buses DB, /DB.

In a write operation, write data from a write amplifier is written in the memory cell c via the data buses DB, /DB, the transfer gates 3a and the first bit line pair BL1, /BL1. In a read operation, data stored in the memory cell c is read via the first bit line pair, BL, /BL1, the transfer gates 3a and the data buses DB, /DB to a read amplifier (not shown).

A reset circuit 50 (60) is connected between the data buses DB, /DB. The reset circuit 50 of a first prior art example is shown in FIG. 2(a) and the reset circuit 60 of a second prior art example is shown in FIG. 3(a). Each reset circuit 50 or 60 receives a reset control signal φeq which transitions in the manners illustrated in FIGS. 2(b) and 3(b). The reset circuit 50 or 60 resets the potential difference between the data buses DB, /DB in response to the high reset control signal φeq applied subsequent to a write operation or a read operation.

As shown in FIG. 2(a), the reset circuit 50 comprises three NMOS transistors Q51, Q52 and Q53. The NMOS transistor Q51 is connected between the data buses DB, /DB, and the NMOS transistors Q52 and Q53 are connected in series between the data buses DB, /DB. A precharge voltage equal to about half of a high potential power supply Vdd (i.e., Vdd/2) is applied to a node between the NMOS transistors Q52 and Q53. The transistors Q51 to Q53 have their gates connected together and receive the reset control signal φeq.

When the NMOS transistors Q51 to Q53 are turned on in response to the high reset control signal φeq, the potentials on the data buses DB, /DB are equalized to Vdd/2 as illustrated in FIG. 2(b), thus resetting the potential difference between the data buses DB, /DB. By the Vdd/2 equalization, a power consumption of the reset circuit 50 is reduced.

As shown in FIG. 3(a), the reset circuit 60 comprises an NMOS transistor Q61, two PMOS transistors Q62 and Q63 and an inverter circuit 61. The NMOS transistor Q61 is connected between the data buses DB, /DB, and the PMOS transistors Q62 and Q63 are connected in series between the data buses DB, /DB. A precharge voltage having a level equal to a high potential power supply Vdd is applied to a node between the transistors Q62 and Q63. A reset control signal φeq is applied to the gate of the transistor Q61. The reset control signal φeq inverted by the inverter circuit 61 is applied to the gates of the PMOS transistors Q62 and Q63.

When the NMOS transistor Q61 and the PMOS transistors Q62 and Q63 are turned on in response to the high reset control signal φeq, the potentials on the data buses DB, /DB are equalized to the high potential power supply level Vdd as illustrated in FIG. 3(b), thus resetting the potential difference between the data buses DB, /DB. Accordingly, if the next cycle is a read cycle, a difference between the potential on any bit line BL1, /BL1 to BL3, /BL3 corresponding to data read from the memory cell c and the potential on the data bus DB or /DB will increase to the supply Vdd level. This improves the charge transfer rate through the associated transfer gate 3a to 3c and reduces the time t1 required until the potential on the data bus DB or /DB is determined. Thus, the read operation is accelerated in the semiconductor memory device 1 using the reset circuit 60.

Since the reset circuit 50 equalizes the potentials on the data buses DB, /DB to the Vdd/2 during the reset operation, a read operation is slow. During the read operation, there is a small difference (Vdd/2) between the potential on any of the first to the third bit line BL1, /BL1 to BL3, /BL3 corresponding to data read from the memory cell c and the potential on the data bus DB or /DB. This slows down the charge transfer rate through the transfer gate 3a to 3c, resulting in a relatively long time t2 until the potential on the data buses DB, /DB is determined, as illustrated in FIG. 2(b).

Since the reset equalizes the potentials on the data buses DB, /DB to Vdd level during the reset operation, power consumption is increased. A write amplifier generally has a greater driving capability than the sense amps 2a to 2c in order to facilitate the charge/discharge process of the data buses and the first to the third bit line pair. An increased power consumption accrues during the reset operation of the write cycle when equalizing the data buses to the Vdd level.

SUMMARY OF THE INVENTION

It is an object of the invention to provide a reset circuit of a semiconductor memory device which enables a higher rate of operation and reduced power consumption.

In a first aspect of the present invention, a semiconductor memory device including a data bus pair is provided. A first reset circuit is connected between the data buses of the data bus pair and resets the data buses to a first potential. A second reset circuit is connected between the data buses of the data bus pair and resets the data buses to a second potential. A control circuit is connected to the first and second reset circuits, activates the first reset circuit, and deactivates the second reset circuit prior to a write operation. The control circuit deactivates the first reset circuit and activates the second reset circuit prior to a read operation.

In a second aspect of the present invention, a semiconductor memory device including a data bus pair. A reset circuit is connected between the data buses of the data bus pair and resets the data buses to one of a high potential power supply voltage and a low potential power supply voltage. A control circuit is connected to the reset circuit, activates the reset circuit prior to a read operation, and deactivates the reset circuit when a write operation is performed.

In a third aspect of the present invention, a method of resetting a pair of data buses in a semiconductor memory device is provided. The memory device includes a first reset circuit connected between the data buses for resetting the data buses to a first potential and a second reset circuit connected between the data buses for resetting the data buses to a second potential. The method includes the steps of activating the first reset circuit and deactivating the second reset circuit prior to a write operation and deactivating the first reset circuit and activating the second reset circuit prior to a read operation.

In a fourth aspect of the present invention, a method of resetting a pair of data buses in a semiconductor memory device is provided. The memory device includes a reset circuit connected between the data buses for resetting the data buses to one of a high potential power supply voltage and a low potential power supply voltage. The method includes the steps of activating the reset circuit prior to a read operation and deactivating the reset circuit when a write operation is performed.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
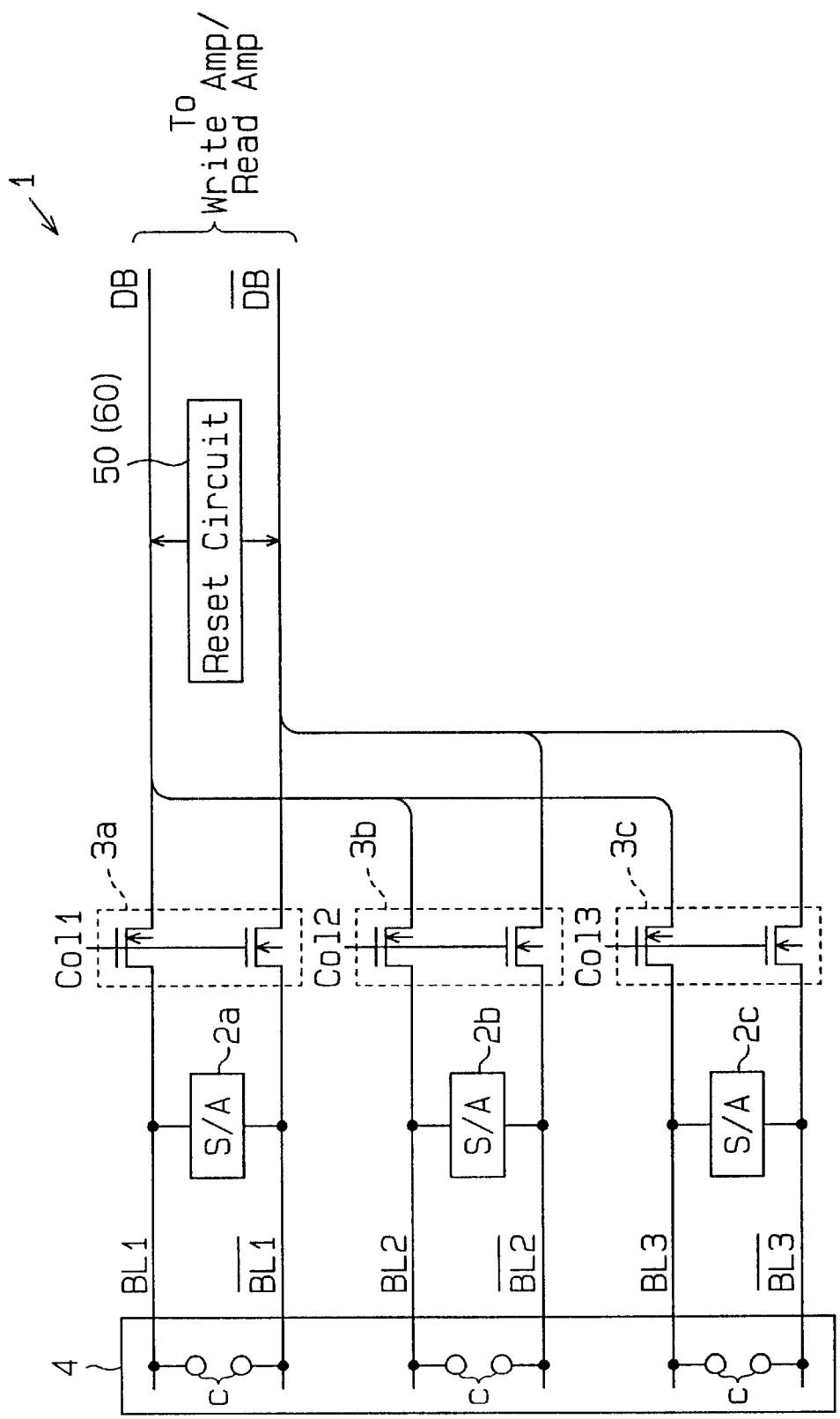
FIG. 1 is a schematic diagram of a part of a conventional semiconductor memory device.
Figure 2A:
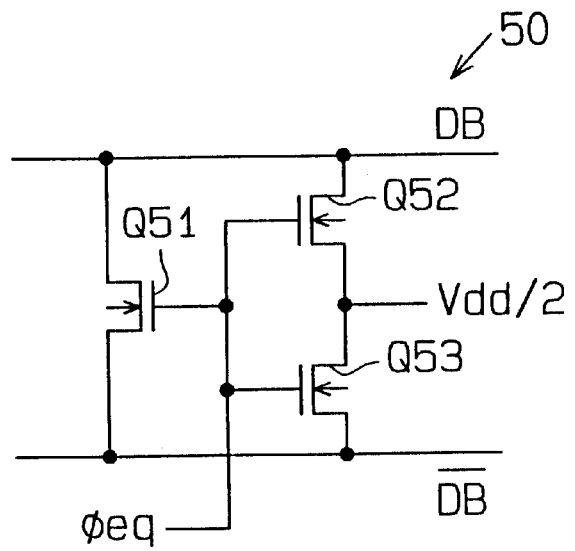
FIG. 2(a) is a circuit diagram of a reset circuit according to a first prior art example.
Figure 2B:
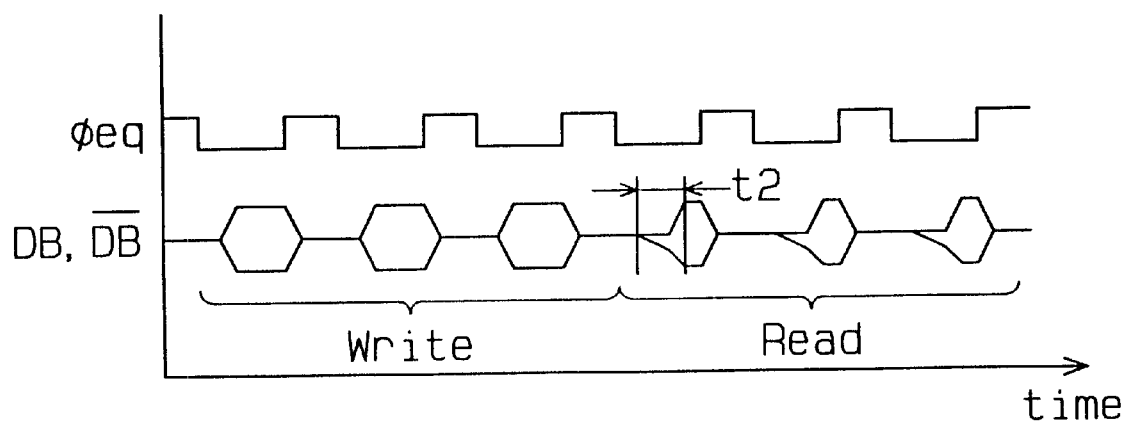
FIG. 2(b) is timing chart illustrating the operation of the reset circuit of FIG. 2(a)
Figure 3A:
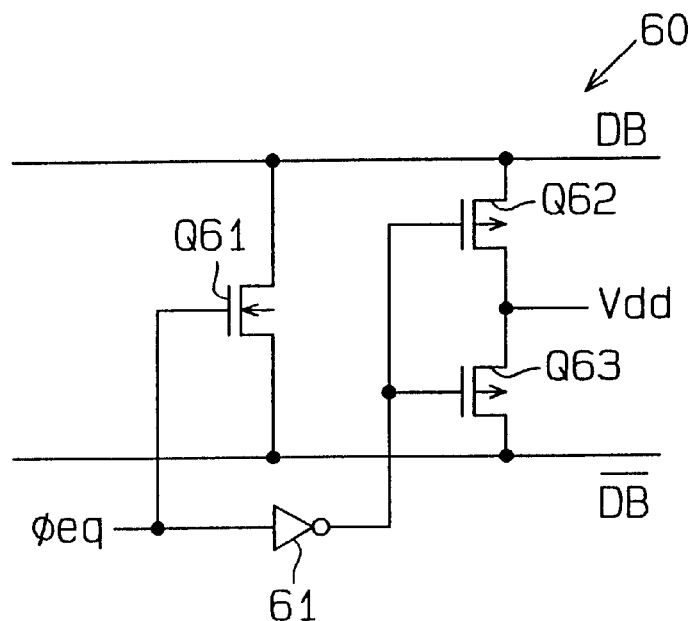
FIG. 3(a) is a circuit diagram of a reset circuit according to a second prior art example.
Figure 3B:
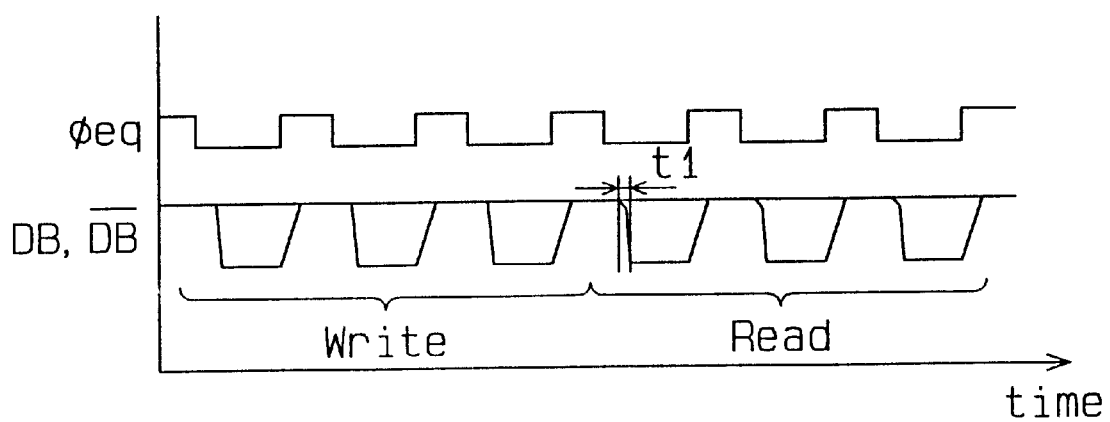
FIG. 3(b) is timing chart illustrating the operation of the reset circuit of FIG. 3(a)

In the drawings, like numerals are used for like elements throughout.

First embodiment

Figure 4:
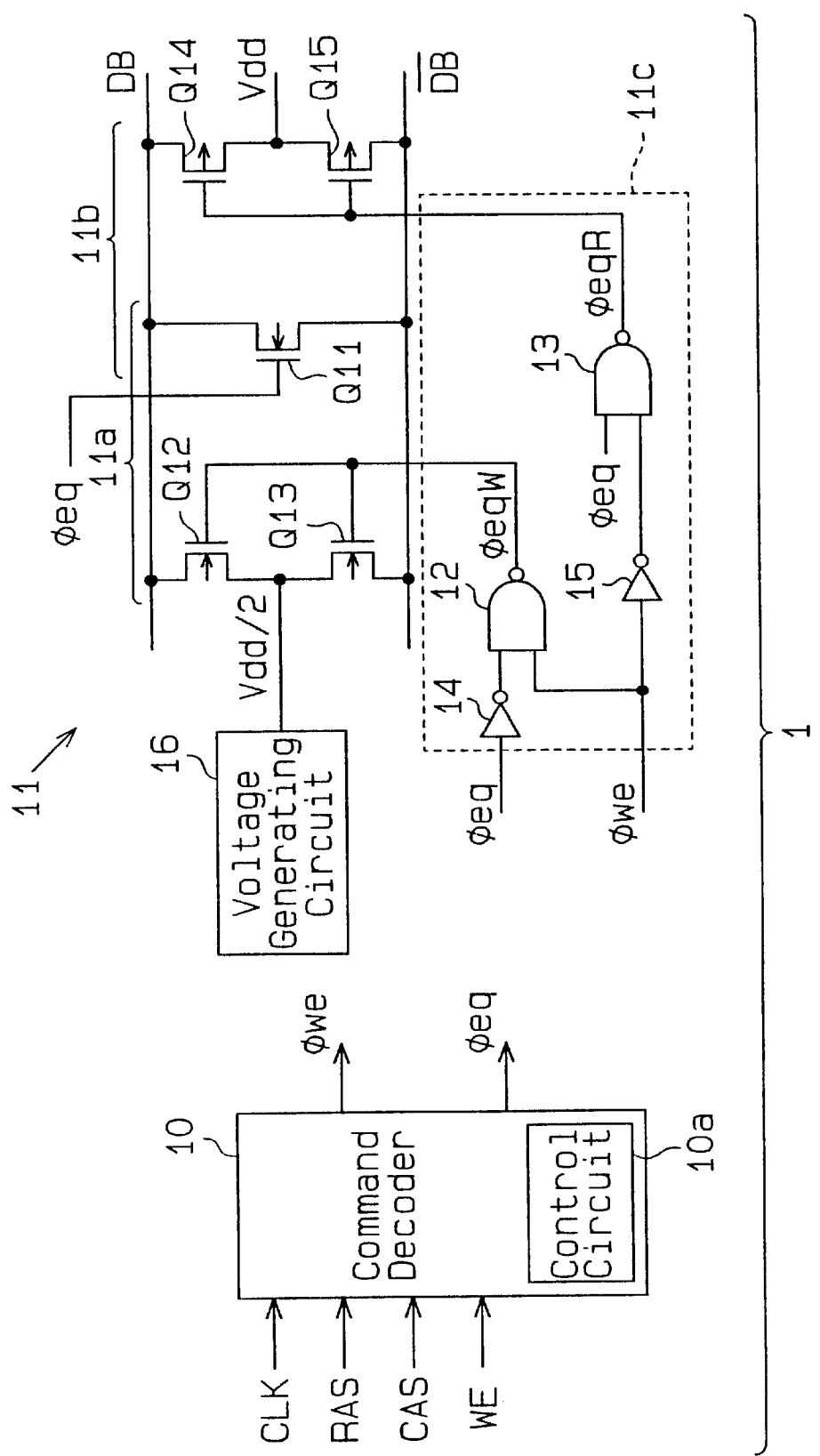
FIG. 4 is a schematic diagram of a reset circuit and a command decoder according to a first embodiment of the present invention.
Figure 5:
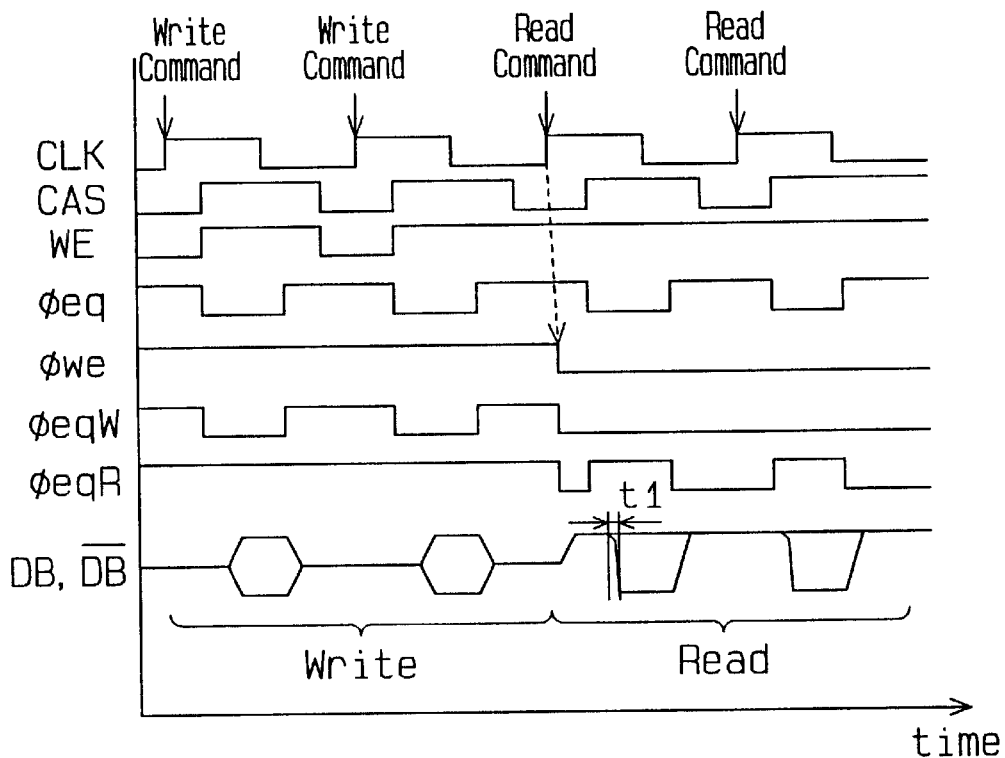
FIG. 5 is a timing chart illustrating the operation of a semiconductor memory device including the reset circuit of FIG. 4.
Figure 6:
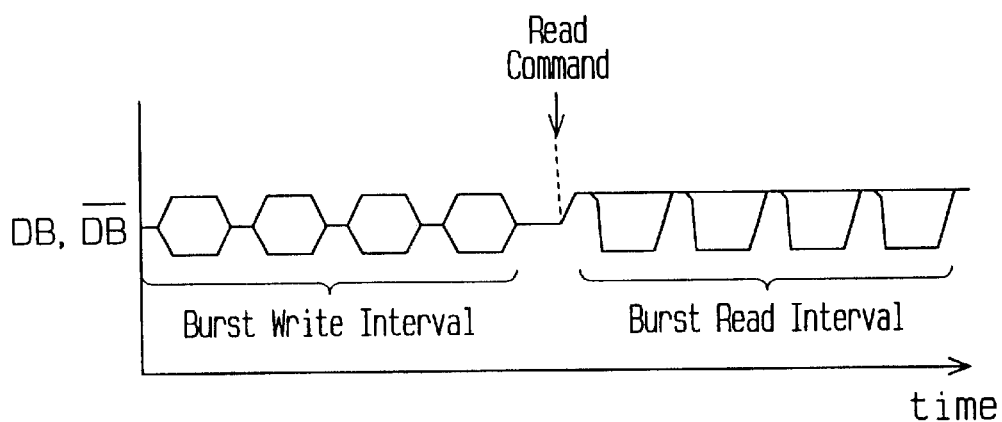
FIG. 6 is a timing chart illustrating the operation of the reset circuit of FIG. 4 during a burst mode.

Referring to FIGS. 4 to 6, a semiconductor memory device according to a first embodiment of the present invention will be described.

As shown in FIG. 4, a semiconductor memory device 1, which is preferably a synchronous dynamic random access memory (SDRAM), comprises a command decoder 10 and a reset circuit 11. The command decoder 10 receives a clock signal CLK, control signals RAS and CAS and a write enable signal WE from an external circuit (not shown). The command decoder 10 supplies the control signals RAS and CAS and the write enable signal WE, which are synchronized with the clock signal CLK, to a memory core (not shown) for controlling the operation of the memory.

The command decoder 10 includes a control circuit 10a, which supplies a reset control signal φeq and a switching signal φwe, which vary in a manner shown in FIG. 5, to the reset circuit 11.

Specifically, upon receiving the signals RAS, CAS and WE, the command decoder 10 decodes them to form commands. The control circuit 10a supplies a high reset control signal φeq having a pulse width corresponding to a time interval during a reset operation of the reset circuit 11. Also, the control circuit 10a supplies a high switching signal φwe to the reset circuit 11 during a write operation interval in response to a write command and supplies a low switching signal φwe to the reset circuit 11 in response to a read command.

The reset circuit 11 comprises first and second reset circuits 11a, 11b, a control circuit 11c and a voltage generating circuit 16. The first reset circuit 11a comprises NMOS transistors Q11, Q12 and Q13 and the second reset circuit 11b comprises NMOS transistor Q11 and PMOS transistors Q14 and Q15. The NMOS transistor Q11 is common to the first and second reset circuits 11a and 11b. The control circuit 11c comprises NAND circuits 12 and 13 and inverter circuits 14 and 15.

The NMOS transistor Q11 is connected between the data buses DB, /DB, and has a gate to which the reset control signal φeq is applied. The NMOS transistor Q11 equalizes the potentials on the data buses DB, /DB in response to the high reset control signal φeq.

The NMOS transistors Q12 and Q13 are connected in series between the data buses DB, /DB. A precharge voltage equal to half of a high potential power supply Vdd or a level of Vdd/2 is applied to a node between the NMOS transistors Q12 and Q13 from the voltage generating circuit 16. The gates of the transistors Q12 and Q13 are connected together and connected to an output terminal of the NAND circuit 12, which in turn receives the reset control signal φeq inverted by the inverter circuit 14, and the switching signal φwe.

The NAND circuit 12 generates a first reset control signal φeqW as illustrated in FIG. 5 in accordance with the inverted reset control signal φeq and the switching signal φwe. The first reset control signal φeqW is applied to the gates of the NMOS transistors Q12 and Q13. The first reset control signal φeqW varies in the same manner as the reset control signal φeq when the switching signal φwe is maintained at an H level or in the write operation interval from the occurrence of a write command to the occurrence of the next read command. The first reset control signal φeqW is set to an L level except for during the write operation.

The PMOS transistors Q14 and Q15 are connected in series between the data buses DB, /DB, and a precharge voltage having a level equal to the high potential power supply Vdd is applied to a node between the transistors Q14 and Q15. The gates of the PMOS transistors Q14 and Q15 are connected together and connected to an output terminal of NAND circuit 13, which has a pair of input terminals receiving the reset control signal φeq and the switching signal φwe inverted by the inverter circuit 15.

The NAND circuit 13 generates a second reset control signal φeqR as illustrated in FIG. 5 in accordance with the reset control signal φeq and the inverted switching signal φwe. The second reset control signal φeqR is applied to the gates of the PMOS transistors Q14 and Q15. The second reset control signal φeqR varies in the same manner as the inverted reset control signal φeq when the switching signal φwe is maintained at an L level or in a read operation interval from the occurrence of a read command to the occurrence of the next write command. The second reset control signal φeqR is set to an H level except for during the read operation.

When the semiconductor memory device 1 begins a write operation in response to the occurrence of the write command as indicated in FIG. 5, the control circuit 11c provides a high first reset control signal φeqW to the first reset circuit 11a in response to a high switching signal ewe. At the same time, the control circuit 11c provides a high second reset control signal φeqR to the second reset circuit 11b. In response to the high switching signal φwe, the control circuit 11c causes the first reset circuit 11a to operate in response to the first reset control signal φeqW, and also disables the second reset circuit 11b by turning the PMOS transistors Q14 and Q15 off.

When the reset control signal φeq and the first reset control signal φeqW go high, the NMOS transistors Q11 to Q13 are turned on, the potentials on the data buses DB, /DB are equalized at Vdd/2, as illustrated in FIG. 5, thus resetting the potential difference between the data buses DB, /DB. In this manner, the data buses DB, /DB are reset to the precharge potential of Vdd/2. Such reset operation is repeated from the occurrence of the write command to the occurrence of the following read command.

When the semiconductor memory device 1 performs a read operation in response to the occurrence of the read command, the reset circuit 11 receives a low switching signal ewe. In response to the low switching signal φwe, the control circuit 11c provides a low first reset control signal φeqW to the first reset circuit 11a, and also provides the second reset control signal φeqR, which varies in the same manner as the inverted reset control signal φeq, to the second reset circuit 11b. Thus, in response to the low switching signal φwe, the control circuit 11c disables the first reset circuit 11a by turning the NMOS transistors Q12 and Q13 off, and activates the second reset circuit 11b in accordance with the second reset control signal φeqR.

When the reset control signal φeq is set to an H level and the second reset control signal φeqR is set to an L level, the NMOS transistor Q11 and the PMOS transistors Q14 and Q15 are turned on, and the potentials on the data buses DB, /DB are equalized to the Vdd level of the high potential power supply as shown in FIG. 5, thus resetting the potential difference between the data buses DB, /DB. In this manner, the data buses DB, /DB are reset to the precharge potential (Vdd). Such reset operation is repeated from the occurrence of the read command to the occurrence of the following write command.

In the write operation, the reset circuit 11 causes the first reset circuit 11a to equalize the potentials on the data buses DB, /DB to Vdd/2, and, in the read operation, causes the second reset circuit 11b to equalize the potentials on the data buses DB, /DB to the supply Vdd level.

Accordingly, the power consumption during the write operation is reduced in the semiconductor memory device 1.

When the current cycle is a write cycle, the write amplifier facilitates the charge/discharge process of the data buses DB, /DB and the first to the third bit line pair BL1, /BL1 to BL3, /BL3 in accordance with the write data. In this manner, equalizing the potentials on the data buses DB, /DB to Vdd/2 in the write operation contributes to reducing the power consumption.

During the read operation, the potentials on the data buses DB, /DB are equalized to the supply Vdd level. Thus, there is a greater difference (the supply Vdd level) between the potential on any of the first to the third bit lines BL1, /BL1 to BL3, /BL3 and the potential on either data buses DB, /DB, which improves the charge transfer rate through the transfer gate 3a to 3c to reduce the length of time t1, as shown in FIG. 5, which is required until the potentials on the data buses DB, /DB are determined. This accelerates the read operation of the semiconductor memory device 1, which results in a further reduction in the power consumption.

In the first embodiment, the reset level of the data buses DB, /DB is switched in accordance with the write command and the read command. Accordingly, the data buses DB, /DB are reset according to the level which follows the command of the previous cycle while waiting for a new command after the completion of the read operation or the write operation.

When the command of the following cycle differs from the command of the preceding cycle, the reset level of the data buses DB, /DB is switched. Accordingly, until the potentials on the buses DB, /DB are stabilized at the reset level, neither the write operation nor the read operation takes place and the operation must wait for the stabilization of the potential. The reset circuit 11 is particularly effective during the burst mode shown in FIG. 6. This is because the write operation and the read operation repeat themselves during the burst mode, with a reduced switching operation between the commands.

Second embodiment

Figure 7:
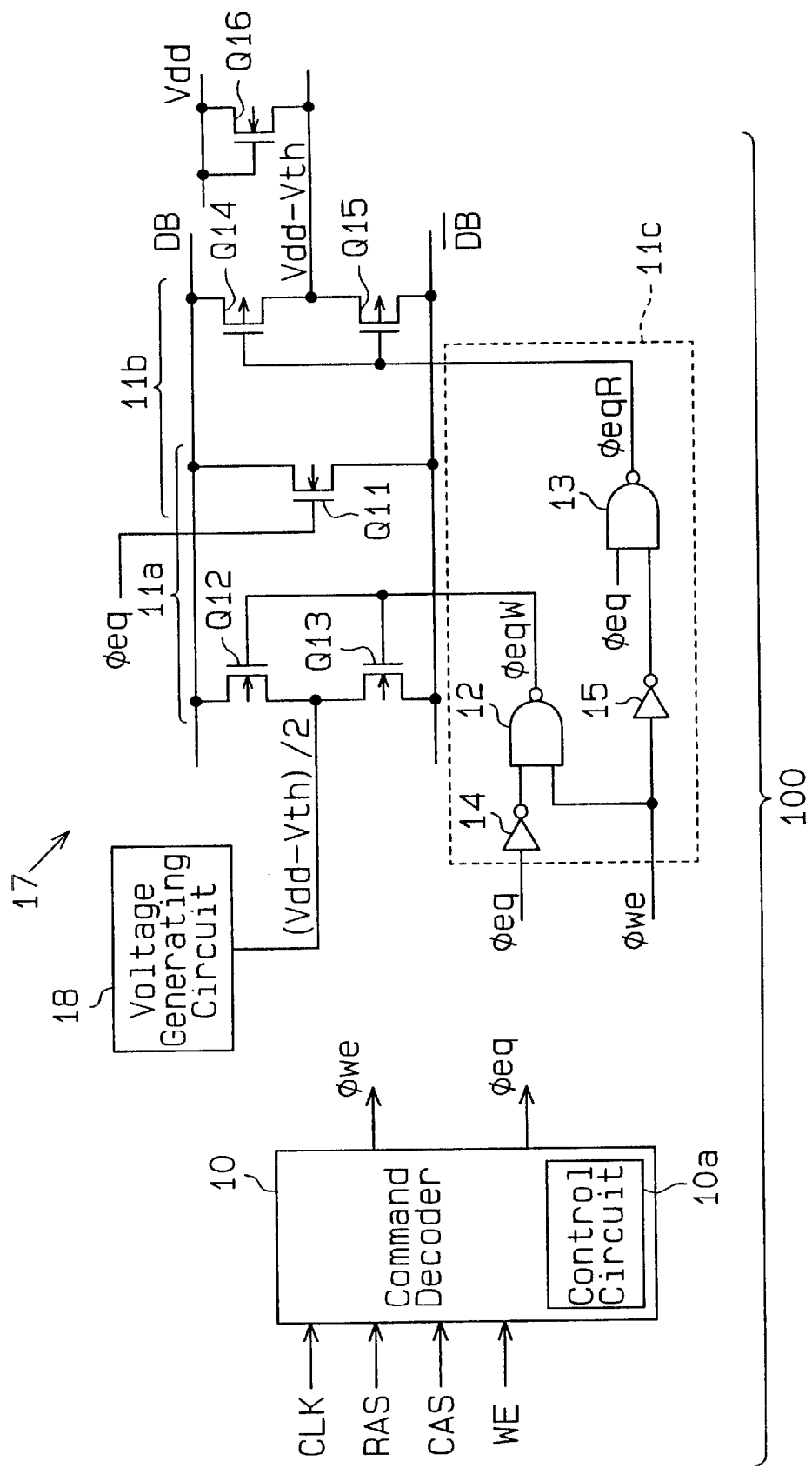
FIG. 7 is a schematic diagram of a reset circuit and a command decoder according to a second embodiment of the present invention.

A reset circuit 17 of a semiconductor memory device 100 according to a second embodiment of the present invention differs from the first embodiment in that an NMOS transistor Q16 is connected between the high potential power supply Vdd and a node between the PMOS transistors Q14 and Q15, as shown in FIG. 7. The reset level of the read operation is set to an any desired precharge voltage level and the reset level of the write operation is set to about half of the precharge voltage.

The NMOS transistor Q16 provides the high potential power supply Vdd to the node between the PMOS transistors Q14 and Q15. In this manner, a precharge voltage (Vdd−Vth), which is lower than the supply voltage Vdd by the threshold voltage Vth of the NMOS transistor Q16, is applied to the node. A precharge voltage generated by a voltage generating circuit 18, which is equal to (Vdd−Vth)/2, is applied to a node between the NMOS transistors Q12 and Q13. The reset level during the write operation is set to (Vdd−Vth)/2 and the reset level during the read operation is set to (Vdd−Vth).

The precharge voltage may be a low potential power supply voltage (VSS). When the precharge voltage has a high level Vdd, it is preferred that NMOS transistors be used as the transfer gates 3a to 3c. On the other hand, when the precharge voltage has a low level (VSS), it is preferred that PMOS transistor be used as the transfer gates 3a–3c. This improves the mobility efficiency of electrons or positive holes of the transfer gates 3a–3c.

The reset circuit 17 may perform an initial reset operation at the same reset level as the read operation when the semiconductor memory device 100 is powered on.

The manner of supplying the precharge voltage (Vdd)/2 may be modified. For example, the voltage generating circuit 18 and the NMOS transistors Q12 and Q13 may be eliminated and the NMOS transistor Q11 may be used to provide a short-circuit between the data buses DB, /DB. In this case, the data buses DB, /DB are set to substantially the intermediate voltage (Vdd/2) during the reset operation.

Third embodiment

Figure 8:
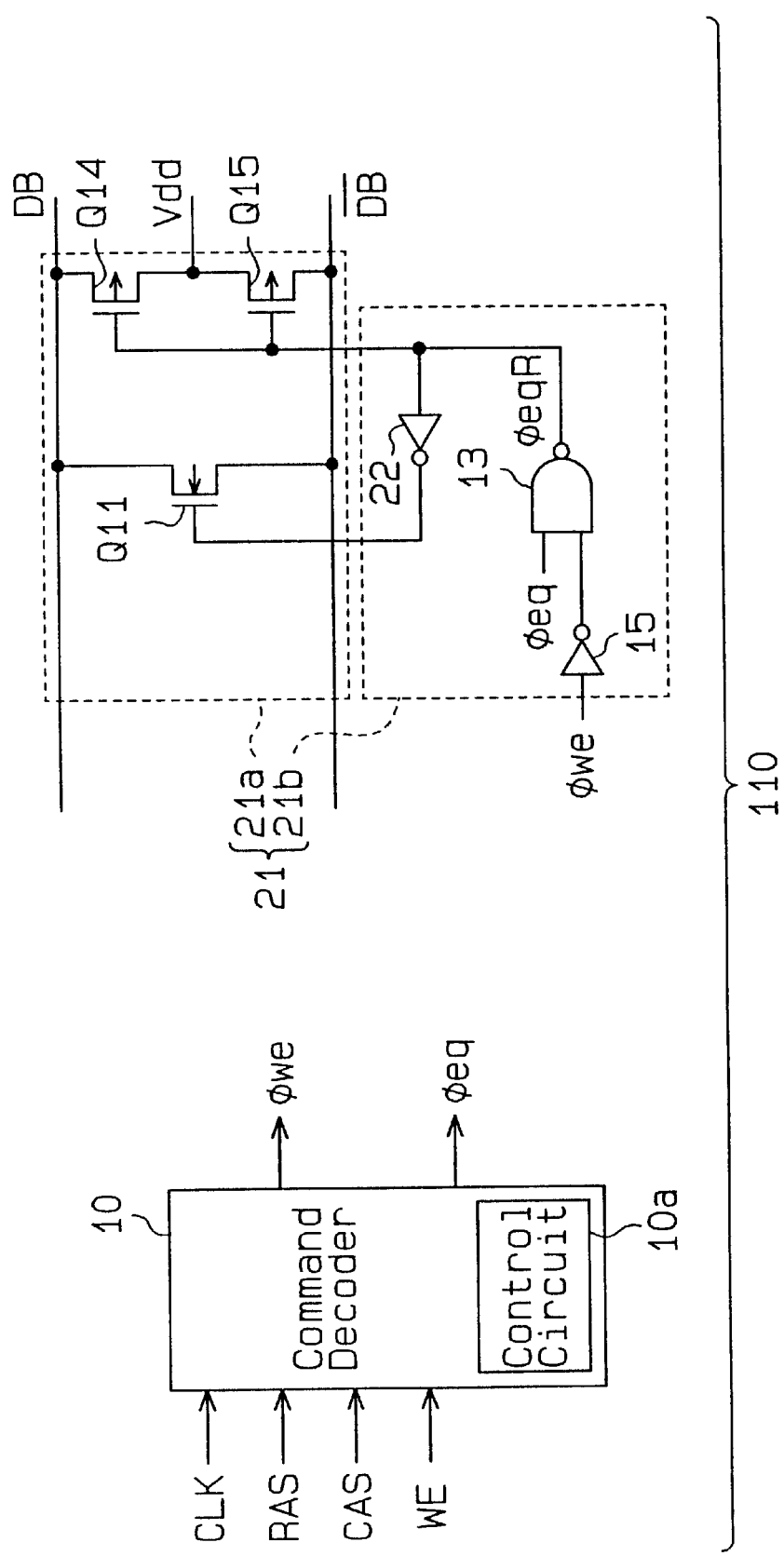
FIG. 8 is a circuit diagram of a reset circuit and a command decoder according to a third embodiment of the present invention.
Figure 9:
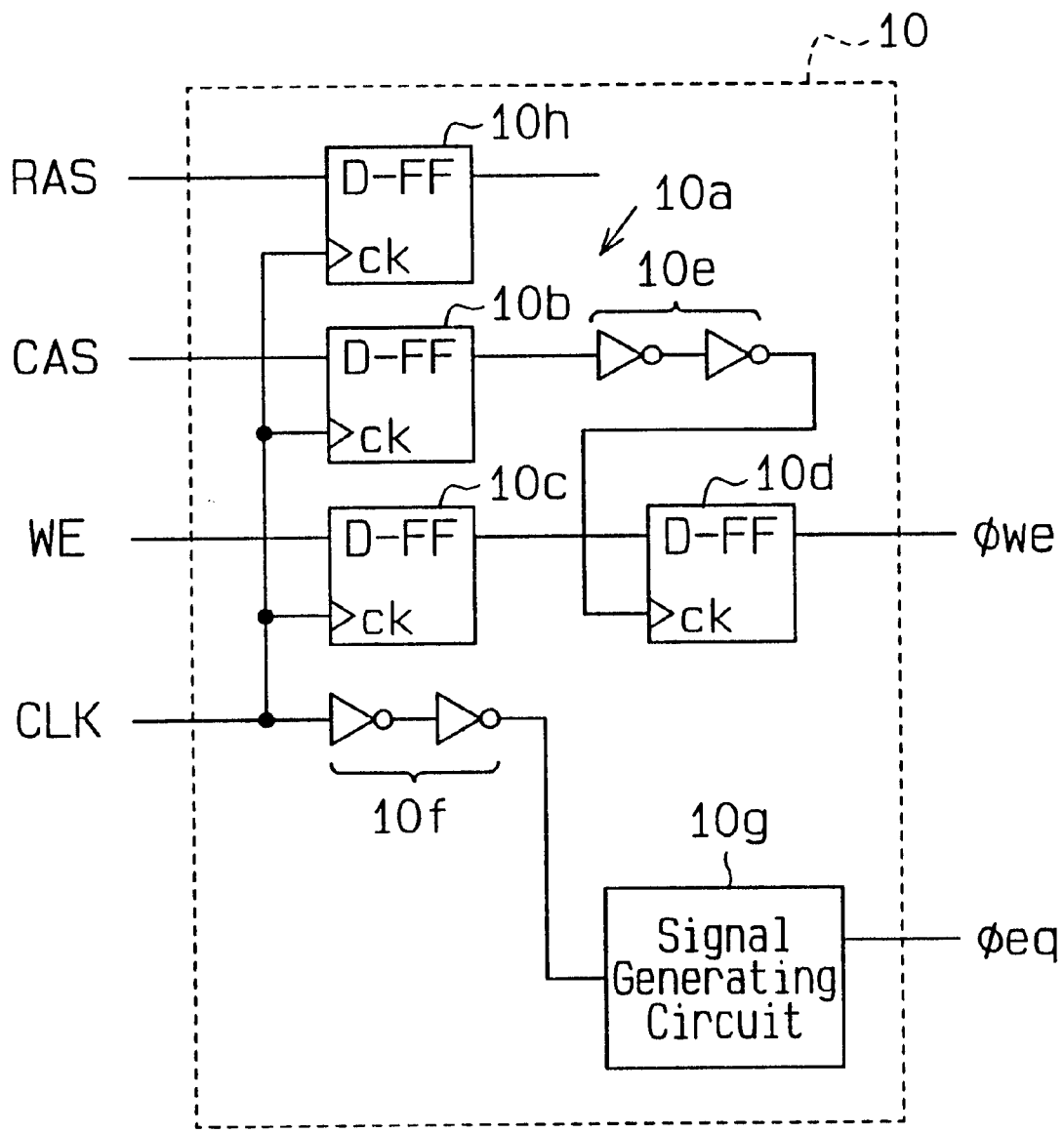
FIG. 9 is a block diagram of the command decoder of FIG. 8.
Figure 10:
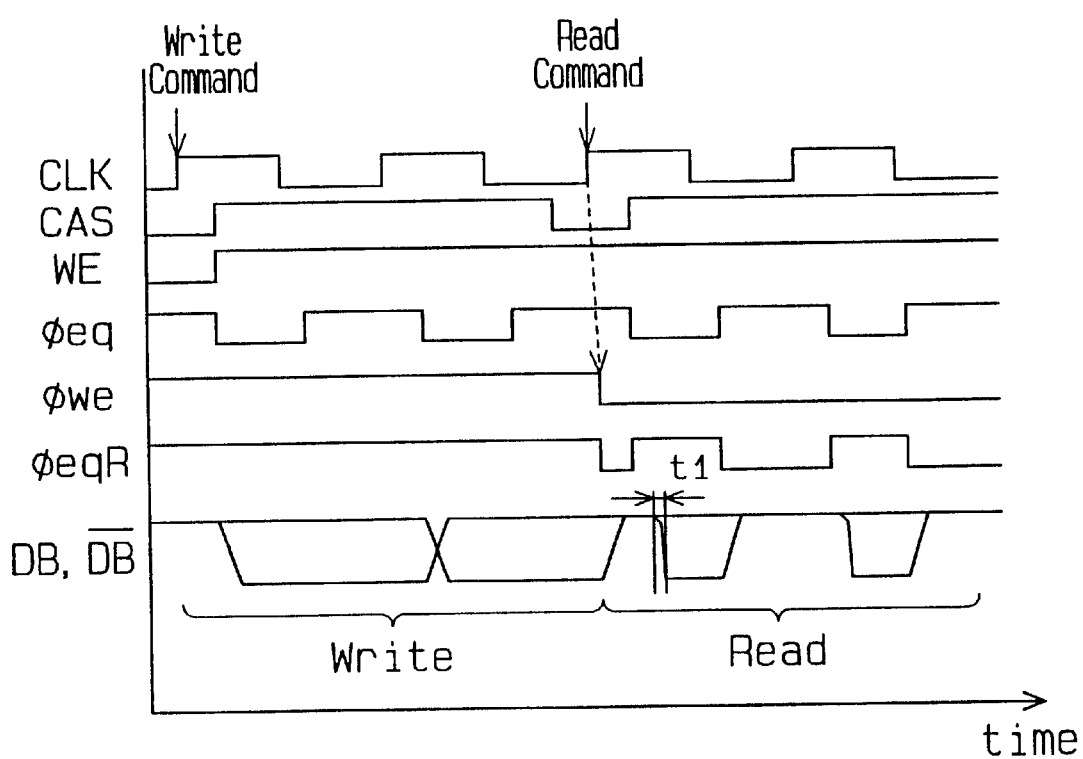
FIG. 10 is a timing chart illustrating the operation of a semiconductor memory device including the reset circuit of FIG. 8.

Referring to FIGS. 8 to 10, a semiconductor memory device 110 according to a third embodiment of the present invention will be described.

As shown in FIG. 8, the semiconductor memory device 110 comprises the command decoder 10 and a reset circuit 21.

Referring to FIG. 9, the command decoder 10 includes a control circuit 10a comprising four D-type flip-flop circuits 10b, 10c, 10d and 10h, two delay circuits 10e and 10f, each formed by two cascaded inverter circuits, and a signal generating circuit 10g.

The D-type flip-flop circuit 10c receives a signal WE applied to its data input terminal and a signal CLK applied to its clock input terminal and generatee an output signal in accordance therewith, which is then applied to a data input terminal of the D-type flip-flop circuit 10d. The D-type flip-flop circuit 10b receives a signal CAS applied to its data input terminal and the signal CLK applied to its clock input terminal and generates an output signal in accordance therewith, which is provided to the clock input terminal of the D-type flip-flop circuit 10d via the delay circuit 10e. The D-type flip-flop circuit 10d generates a switching signal φwe which varies in a manner shown in FIG. 10 and provides the signal φwe to the reset circuit 21. The signal generating circuit 10g receives the clock signal CLK via the delay circuit 10f, generates a reset control signal φeq which varies in a manner illustrated in FIG. 10 in accordance with the clock signal CLK, and provides the reset control signal to the reset circuit 21.

Returning to FIG. 8, the reset circuit 21 comprises an inner reset circuit 21a and a control circuit 21b. The inner reset circuit 21a comprises transistors Q11, Q14 and Q15 and the control circuit 21b comprises a NAND circuit 13 and inverter circuits 15 and 22.

The NAND circuit 13 receives the reset control signal φeq and the switching signal φwe inverted by the inverter circuit 15 and generates a reset control signal φeqR as illustrated in FIG. 10.

The reset control signal φeqR is inverted by the inverter circuit 22 before it is applied to the gate of the NMOS transistor Q11, and is directly applied to the gates of the PMOS transistors Q14 and Q15. Accordingly, the transistors Q11, Q14 and Q15 are turned on in response to a low reset control signal φeqR, which equalizes the data buses DB, /DB to the level of the high potential power supply Vdd.

As shown in FIG. 10, the reset control signal φeqR is set to an H level during the write operation when the switching signal φwe is an H level, and varies in the same manner as the inversion of the reset control signal φeq during the read operation interval when the switching signal is an L level.

When the semiconductor memory device 110 performs the write operation, the control circuit 21b receives a high switching signal φwe and provides a high reset control signal φeqR to the inner reset circuit 21a irrespective of the reset control signal φeq. Thus, during the write operation, the control circuit 21b disables the reset circuit 21a by turning the transistors Q11, Q14 and Q15 off. Hence, the inner reset circuit 21a does not perform a reset operation and thus does not reset the potential difference between the data buses DB, /DB.

When the semiconductor memory device 110 performs the read operation in response to the read command, the control circuit 21b receives a low switching signal φwe and provides the reset control signal φeqR, which varies in the same manner as the inversion of the reset control signal φeq, to the inner reset circuit 21a. Thus, during the read operation, the control circuit 21b causes the reset circuit 21c to perform a reset operation in response to the reset control signal φeq.

Specifically, referring to FIG. 10, the transistors Q11, Q14 and Q15 are all turned on in response to the low reset control signal φeqR. The potentials on the data buses DB, /DB are equalized at the high potential power supply Vdd level, thus resetting the potential difference between the data buses DB, /DB.

In this manner, the reset circuit 21 does not perform a reset operation during the write operation and causes the inner rest circuit 21a to equalize the potentials on the data buses DB, /DB at the supply voltage Vdd level during the read operation.

During the write operation, the operation of the write amplifier facilitates the charge/discharge process of the data buses DB, /DB and the first to the third bit line pairs BL1, /BL1 to BL3, /BL3. Since there is no need for the resetting of the data buses DB, /DB during the write operation, that amount of power consumption which would be required for the reset operation is eliminated.

The resulting reduction in the power consumption during the write operation as well as the higher rate of the read operation because the data buses DB, /DB are equalized to the supply Vdd level during the read operation, allows for a reduction in the power consumption and an increase in the rate of operation of the semiconductor memory device 110.

Fourth embodiment

Figure 11:
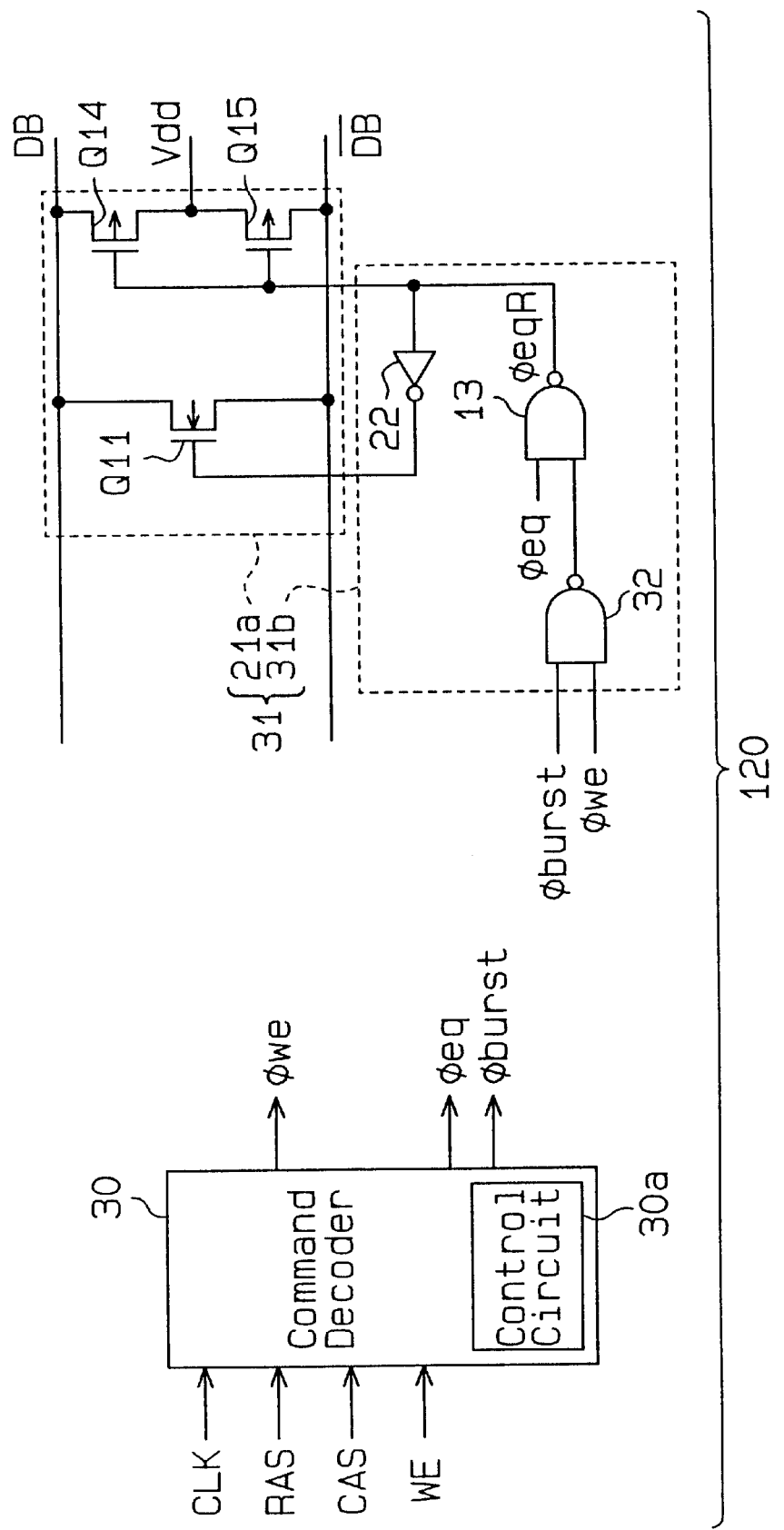
FIG. 11 is a schematic diagram of a reset circuit and a command decoder according to a fourth embodiment of the present invention.
Figure 12:
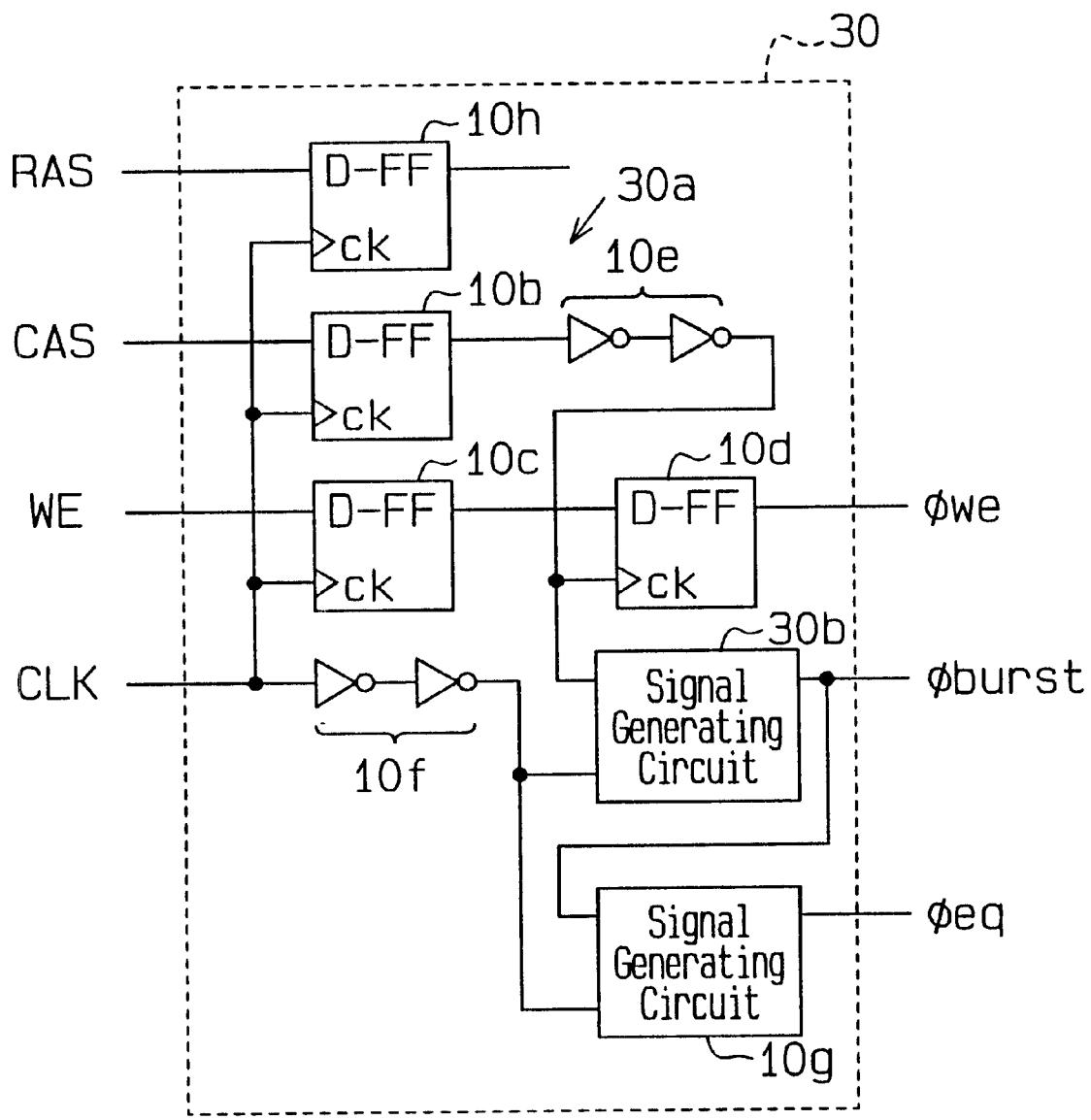
FIG. 12 is a block diagram of the command decoder of FIG. 11.
Figure 13:
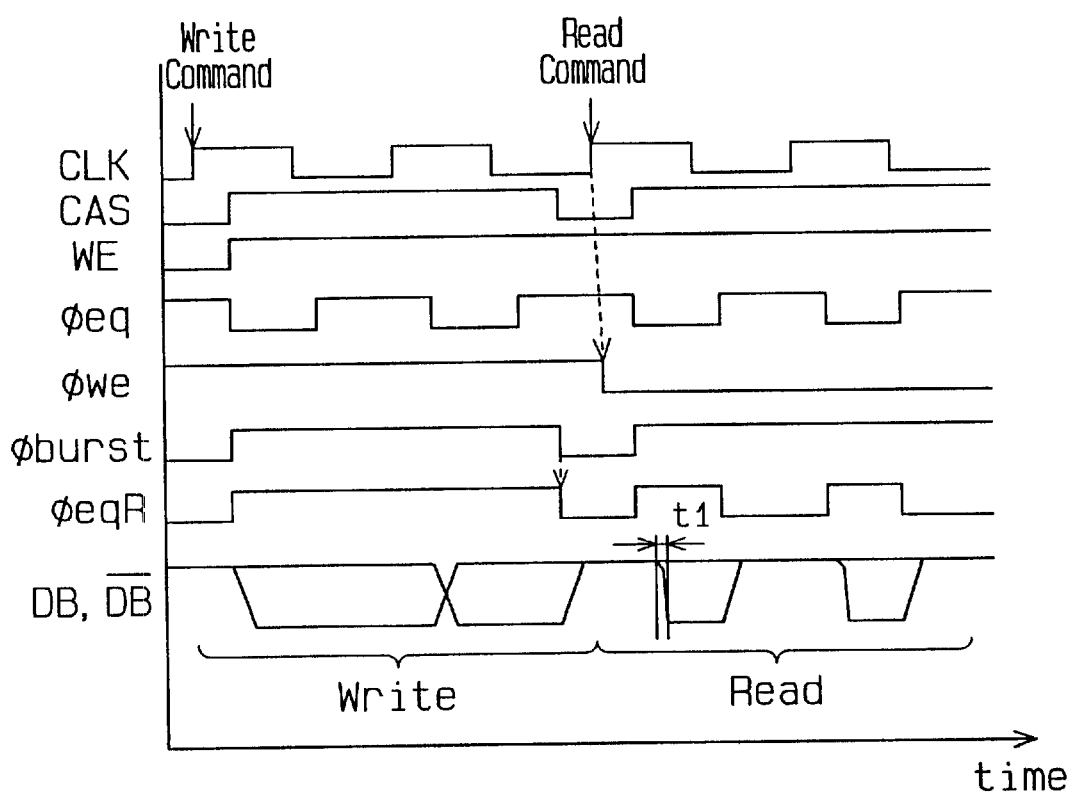
FIG. 13 is a timing chart illustrating the operation of a semiconductor memory device including the reset circuit of FIG. 11.

Referring now to FIGS. 11 to 13, a semiconductor memory device 120 according to a fourth embodiment of the present invention will be described. The semiconductor memory device 120 is capable of performing a burst transfer operation.

As shown in FIG. 11, the semiconductor memory device 120 comprises a reset circuit 31 and a command decoder 30 including a control circuit 30a. As shown in FIG. 12, in comparison with the control circuit 10a of FIG. 9, the control circuit 30a includes a second signal generating circuit 30b.

The second signal generating circuit 30b receives signals from the delay circuits 10e and 10f, generates a burst mode detection signal φburst which varies in a manner illustrated in FIG. 13 and provides it to the reset circuit 31. The first signal generating circuit 10g receives the signal from the delay circuit 10f and the burst mode detection signal φburst from the signal generating circuit 30b, generates a reset control signal φeq which varies in a manner illustrated in FIG. 13 and provides it to the reset circuit 31.

Returning to FIG. 11; the reset circuit 31 comprises inner reset circuit 21a and a control circuit 31b. The control circuit 31b includes a NAND circuit 32 connected to the NAND circuit 13. The NAND circuit 32 receives the burst mode detection signal φburst and a switching signal φwe, generates a signal according to the signals φburst and φwe, and provides it to the NAND circuit 13. The NAND circuit 13 receives the reset control signal φeq and the signal from the NAND circuit 32 and generates a reset control signal φeqR which is illustrated in FIG. 13.

The reset control signal φeqR is inverted by the inverter circuit 22 before it is applied to the gate of the NMOS transistor Q11. The reset control signal φeqR is also applied to the gates of the PMOS transistors Q14 and Q15. The transistors Q11, Q14 and Q15 are all turned on in response to a low reset control signal φeqR, thus equalizing the data buses DB, /DB at the high potential power supply Vdd level.

Referring to FIG. 13, the reset control signal φeqR is set to an H level when the switching signal φwe is at an H level (the write operation) and the burst mode detection signal φburst is at an H level (the burst mode). In other words, the reset control signal φeqR is set to an H level during the burst write operation. During intervals other than the burst mode operation (i.e., the normal write operation and the read operation), the reset control signal φeqR varies in the same manner as the inverted reset control signal φeq.

As shown in FIG. 13, when the semiconductor memory device 120 enters the write operation in response to the write command, the reset circuit 31 receives a high switching signal φwe.

When the write operation is a normal write operation, the control circuit 31b receives a low burst mode detection signal φburst and provides the reset control signal φeqR, which varies in the same manner as the inverted reset control signal φeq, to the inner reset circuit 21a. Thus, during the normal write operation interval, the control circuit 31b causes the inner reset circuit 21a to perform a reset operation in response to the reset control signal φeqR, thus equalizing the potentials on the data buses DB, /DB at the high potential power supply Vdd level.

When the write operation is a burst write operation, the control circuit 31b receives a high burst mode detection signal φburst and a high switching signal φwe and provides a high reset control signal φeqR to the inner reset circuit 21a irrespective of the reset control signal φeq. Thus, during the burst write operation interval, the control circuit 31b disables the inner reset circuit 21a by turning all of the transistors Q11, Q14 and Q15 off. In this manner, the reset operation is not performed by the reset circuit 21a during the burst write operation.

When the burst write operation is finished (or when the burst mode detection signal φburst goes low) and the reset control signal φeq goes high, the reset control signal φeqR is set to an L level. In response to the low reset control signal φeqR, the control circuit 31b causes the reset circuit 21a to perform a reset operation, thus equalizing the potentials of the data buses DB, /DB at the high potential power supply Vdd level. Thus, the reset operation is performed prior to the read operation.

When the semiconductor memory device 120 performs the read operation in response to the read command, the control circuit 31b receives a low switching signal φwe and provides the reset control signal φeqR, which varies in the same manner as the inverted reset control signal φeq, to the reset circuit 21a, irrespective of the burst mode detection signal φburst. Thus, during the read operation interval, the control circuit 31b causes the reset circuit 21a to perform a reset operation in response to the reset control signal φeqR, equalizing the potentials on data buses DB, /DB at the high potential power supply Vdd level.

As mentioned above, the reset circuit 31 does not perform a reset operation during the burst write operation. During the normal write operation and the read operation, the reset circuit 21a equalizes the potentials on data buses DB, /DB to the power supply Vdd level, thus reducing the power consumption during the burst write operation.

In addition, a reset operation is performed upon completion of the burst write operation or after the burst mode detection signal φburst goes low. In other words, the reset operation is performed prior to the read operation, thus reducing the switching time of the read operation. Thus, the power consumption is reduced and the rate of operation is increased in the semiconductor memory device 120.

Fifth embodiment

Figure 14:
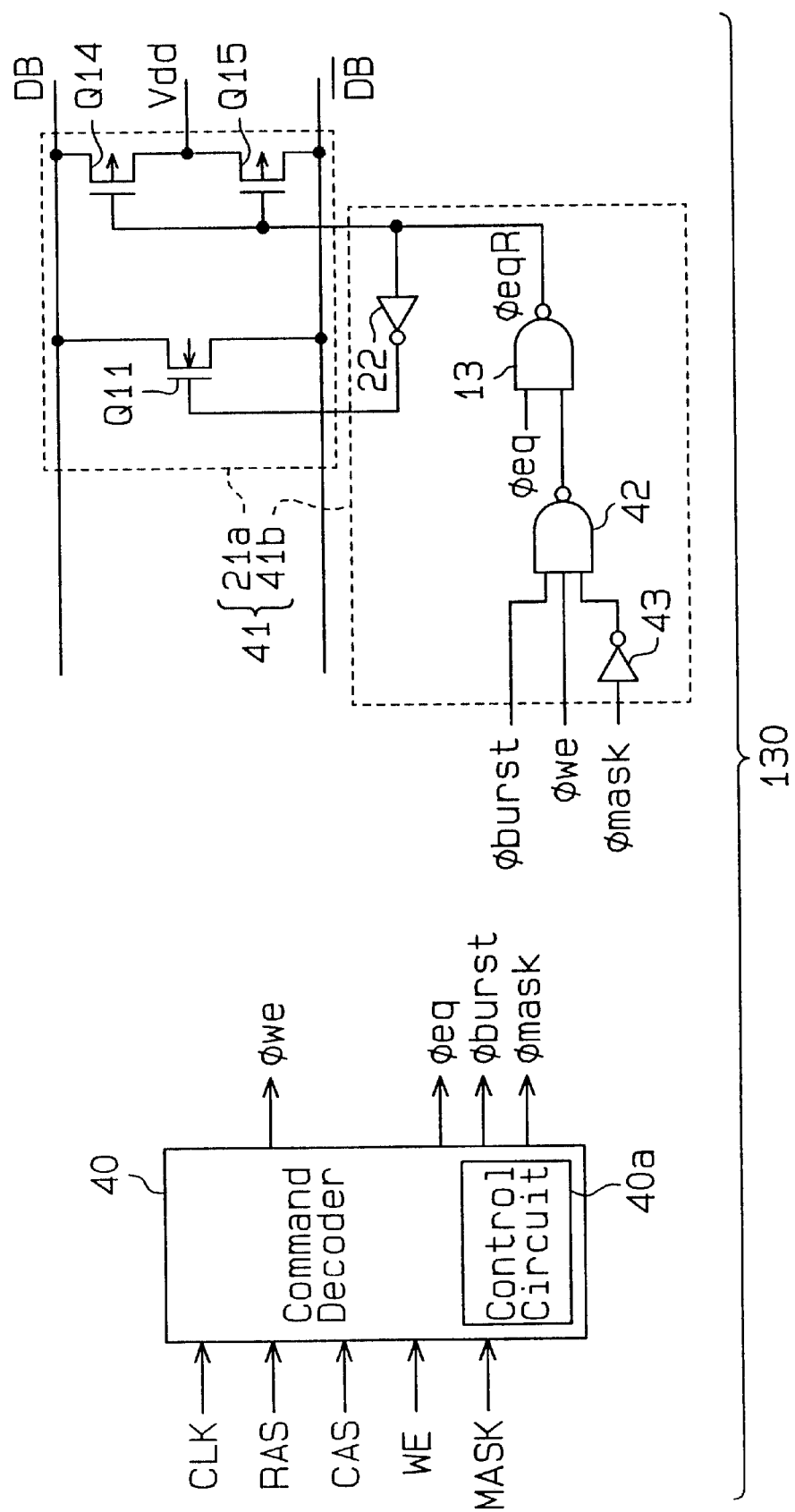
FIG. 14 is a schematic diagram of a reset circuit and a command decoder according to a fifth embodiment of the present invention.
Figure 15:
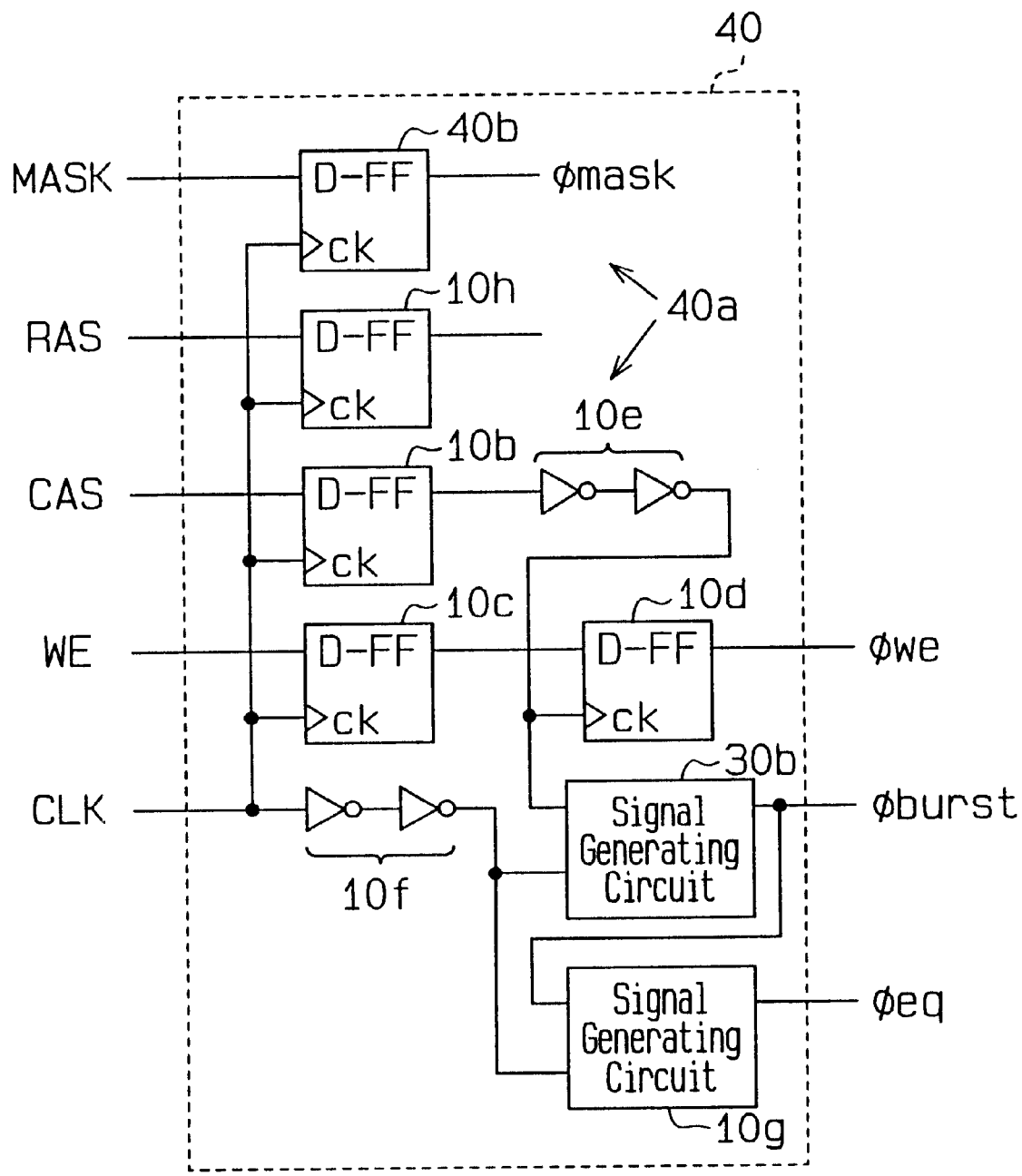
FIG. 15 is a block diagram of the command decoder of FIG. 14.
Figure 16:
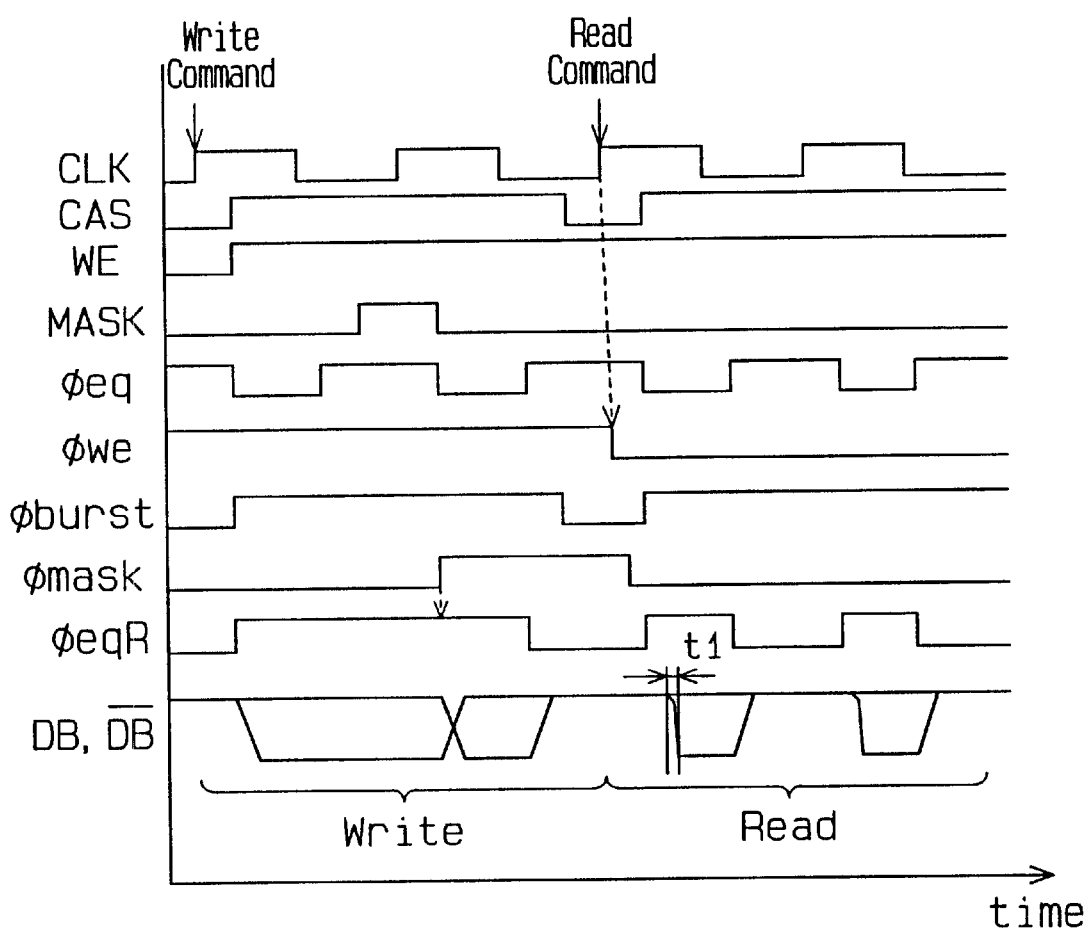
FIG. 16 is a timing chart illustrating the operation of a semiconductor memory device including the reset circuit of FIG. 15.

Referring to FIGS. 14 to 16, a semiconductor memory device 130 according to a fifth embodiment of the present invention will be described. The semiconductor memory device 130 is capable of performing a burst transfer operation and a write mask operation.

As shown in FIG. 14, the semiconductor memory device 130 comprises a reset circuit 41 and a command decoder 40 including a control circuit 40a. The reset circuit 41 includes the inner reset circuit 21a and a control circuit 41b.

The command decoder 40 receives a mask mode detection signal MASK and the signals CLK, RAS, CAS and WE and generates a switching signal φwe, a reset control signal φeq, a burst mode detection signal φburst and a mask mode detection signal φmask. As shown in FIG. 15, in comparison to the control circuit 30a of FIG. 12, the control circuit 40a also includes a D-type flip-flop circuit 40b which receives a mask mode detection signal MASK. The D-type flip-flop circuit 40b receives the mask mode detection signal MASK applied to its data input terminal and a signal CLK applied to its clock input terminal, generates a mask mode detection mode φmask, which varies, in a manner illustrated in FIG. 16, and provides it to the reset circuit 41.

Returning to FIG. 14, the control circuit 41b comprises a three input NAND circuit 42 which receives the burst mode detection signal φburst, the switching signal φwe and the mask mode detection mode φmask which is inverted by an inverter 43. The NAND circuit 13 receives the reset control signal φeq and the signal from the NAND circuit 42 and generates the reset control signal φeqR as illustrated in FIG. 16.

The reset control signal φeqR is inverted by an inverter circuit 22 before it is applied to the gate of the NMOS transistor Q11 and is also directly applied to the gates of the PMOS transistors Q14 and Q15. The transistors Q11, Q14 and Q15 are all turned on in response to the reset control signal φeqR, equalizing the data buses DB, /DB at the high potential power supply vdd level.

Referring to FIG. 16, the reset control signal φeqR is set to an H level when the switching signal φwe is at an H level (the write operation), the burst mode detection signal φburst is at an H level (the burst mode), and the mask mode detection signal φmask is at an L level (the time other than the mask mode). In other words, the reset control signal φeqR is set to an H level during the burst write operation except for the write mask operation. During the normal write operation, the write mask operation, and the read operation, the reset control signal φeqR varies in the same manner as the inverted reset control signal φeq.

When the semiconductor memory device 130 performs the write operation in response to the write command, as illustrated in FIG. 16, the reset circuit 41 receives a high switching signal φwe.

When the write operation is a normal write operation, the control circuit 41b receives a low burst mode detection signal φburst and provides the reset control signal φeqR, which varies in the same manner as the inverted reset control signal φeq, to the reset circuit 21a. Thus, during the normal write operation, the reset circuit 21a performs a reset operation in response to the reset control signal φeqR, equalizing the potentials on the data buses DB, /DB at the high potential power supply Vdd level.

When the write operation is a burst write operation, the control circuit 41b receives a high burst mode detection signal φburst and a high switching signal φwe and provides a high reset control signal φeqR to the reset circuit 21a, irrespective of the reset control signal φeq. Thus, during the burst write operation, the control circuit 41b disables the reset circuit 21a by turning the transistors Q11, Q14 and Q15 off. In this manner, the reset circuit 21a does not perform a reset operation during the burst write operation.

When the burst write operation mode shifts to the write mask operation mode, the the control circuit 41b receives a high mask mode detection signal φmask and provides the reset control signal φeqR, which varies in the same manner as the inverted reset control signal φeq, to the reset circuit 21a. Thus, during the write mask operation, the reset circuit 21a performs a reset operation in response to the reset control signal φeqR, equalizing the potentials on the data buses DB, /DB at the high potential power supply Vdd level. That is, a reset operation is performed prior to the read operation.

When the semiconductor memory device 130 shifts to the read operation from the write mask operation in response to the read command, the control circuit 41b receives a low switching signal φwe and provides the reset control signal φeqR, which varies in the same manner as the inverted reset control signal φeq, to the reset circuit 21a irrespective of the burst mode detection signal φburst. Thus, during the read operation, the reset circuit 21a performs a reset operation in response to the reset control signal φeqR, thus equalizing the potentials on the data buses DB, /DB at the high potential power supply Vdd level.

As mentioned above, the reset circuit 41 does not perform a reset operation during the burst write operation, except for when in the write mask mode. The reset circuit 21a equalizes the potentials on the data buses DB, /DB at the supply voltage Vdd level during the normal write operation, the write mask operation and the read operation. The power consumption which occurs during the burst write operation is reduced.

In addition, the reset operation is performed after the completion of the write mask operation or after the mask mode detection mode φmask goes high. In other words, the reset operation precedes the read operation, reducing the switching time to the read operation. Accordingly, a reduction in the power consumption and an increase in the rate of operation are achieved in the semiconductor memory device 130.

It should be apparent to those skilled in the art that the present invention may be embodied in many other specific forms without departing from the spirit or scope of the invention. Particularly, it should be understood that the invention may be embodied in the following forms.

The precharge voltage is not limited to the level of the high potential power supply Vdd, but may be chosen to be equal to the level of a low potential power supply (Vss). When a precharge voltage is chosen to be equal to the level of the high potential power supply Vdd, the transfer gates 2a to 3c formed by the NMOS transistors are used. When the precharge voltage is chosen to be equal to the level of the low potential power supply (Vss), the transfer gates formed by PMOS transistors are preferably used. This improves the mobility efficiency of electrons or positive holes of the transfer gates.

The present examples and embodiments are to be considered as illustrative and not restrictive and the invention is not to be limited to the details given herein, but may be modified within the scope and equivalence of the appended claims.

What is claimed is:

1. A semiconductor memory device comprising:
   a data bus pair;
   a reset circuit connected between the data buses of the data bus pair for resetting the data buses to one of a high potential power supply voltage and a low potential power supply voltage; and
   a control circuit connected to the reset circuit for activating the reset circuit prior to a read operation and deactivating the reset circuit when a write operation is performed.

2. The device according to claim 1, wherein the reset circuit resets the data buses to the high potential power supply voltage.

3. The device according to claim 1, wherein the reset circuit includes a pair of MOS transistors connected in series between the data buses of the data bus pair and, one of the high potential power supply voltage and the low potential power supply voltage is applied to a node between the pair of MOS transistors.

4. The device according to claim 3, wherein the control circuit provides a reset control signal to the pair of MOS transistors.

5. The device according to claim 1, wherein the reset circuit performs a reset operation after completion of a burst write operation.

6. The device according to claim 1, wherein the reset circuit does not perform a reset operation in a burst write operation.

7. The device according to claim 1, wherein the reset circuit performs a reset operation after initiation of a write mask operation.

8. A method of resetting a pair of data buses in a semiconductor memory device including a reset circuit connected between the data buses for resetting the data buses to one of a high potential power supply voltage and a low potential power supply voltage, the method comprising the steps of:

activating the reset circuit prior to a read operation; and deactivating the reset circuit when a write operation is performed.

9. The method according to claim 8, wherein the step of activating the reset circuit includes activating the reset circuit after completion of a burst write operation.

10. The method according to claim 8, wherein the step of deactivating the reset circuit includes deactivating the reset circuit during a burst write operation.

11. The method according to claim 8, wherein the step of activating the reset circuit includes activating the reset circuit after initiation of a write mask operation.

* * * * *